United States Patent
Min et al.

(10) Patent No.: US 12,100,625 B2
(45) Date of Patent: Sep. 24, 2024

(54) SEMICONDUCTOR DEVICE WITH AIR GAPS BETWEEN METAL GATES AND METHOD OF FORMING THE SAME

(71) Applicant: Taiwan Semiconductor Manufacturing Co., Ltd., Hsin-Chu (TW)

(72) Inventors: Wei-Lun Min, Hsinchu (TW); Xusheng Wu, Hsinchu (TW); Chang-Miao Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/358,708

(22) Filed: Jul. 25, 2023

(65) Prior Publication Data

US 2023/0369128 A1    Nov. 16, 2023

Related U.S. Application Data

(60) Continuation of application No. 17/861,679, filed on Jul. 11, 2022, now Pat. No. 11,756,835, which is a division of application No. 16/931,703, filed on Jul. 17, 2020, now Pat. No. 11,387,146.

(60) Provisional application No. 62/906,149, filed on Sep. 26, 2019.

(51) Int. Cl.
*H01L 27/088*    (2006.01)
*H01L 21/764*    (2006.01)
*H01L 21/8234*   (2006.01)

(52) U.S. Cl.
CPC .... *H01L 21/823481* (2013.01); *H01L 21/764* (2013.01); *H01L 21/823431* (2013.01); *H01L 27/0886* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Jack S Chen
(74) *Attorney, Agent, or Firm* — HAYNES AND BOONE, LLP

(57) ABSTRACT

Semiconductor device and the manufacturing method thereof are disclosed herein. An exemplary semiconductor device comprises a first semiconductor fin and a second semiconductor fin formed over a substrate, wherein lower portions of the first semiconductor fin and the second semiconductor fin are separated by an isolation structure; a first gate stack formed over the first semiconductor fin and a second gate stack formed over the second semiconductor fin; and a separation feature separating the first gate stack and the second gate stack, wherein the separation feature includes a first dielectric layer and a second dielectric layer with an air gap defined therebetween, and a bottom portion of the separation feature being inserted into the isolation structure.

20 Claims, 11 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 11,387,146 B2 * | 7/2022 | Min ................ H01L 21/823431 |
| 2020/0075417 A1 | 3/2020 | Lee et al. |
| 2021/0098309 A1 | 4/2021 | Min et al. |

* cited by examiner

SEMICONDUCTOR DEVICE WITH AIR GAPS BETWEEN METAL GATES AND METHOD OF FORMING THE SAME

The present application is a continuation application of U.S. patent application Ser. No. 17/861,679, filed Jul. 11, 2022, which is a divisional application of U.S. patent application Ser. No. 16/931,703, filed Jul. 17, 2020 and issued as U.S. Pat. No. 11,387,146 Jul. 12, 2022, which claims benefit of U.S. Provisional Patent Application No. 62/906,149, filed Sep. 26, 2019, each of which is incorporated herein by reference in its entirety.

BACKGROUND

The electronics industry has experienced an ever-increasing demand for smaller and faster electronic devices which are simultaneously able to support a greater number of increasingly complex and sophisticated functions. These goals have been achieved by scaling down semiconductor IC dimensions (e.g., minimum feature size) and thereby improving production efficiency and lowering associated costs. However, aggressive scaling down of IC dimensions has resulted in some deficiencies of the semiconductor device. For example, it has been observed that the parasitic gate-to-gate capacitance is increased due to the decreased distance between the adjacent metal gates. The parasitic capacitance may reduce the ring oscillator frequency and degrade the circuit performance. Thus, improvements to the structure of the semiconductor device is needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
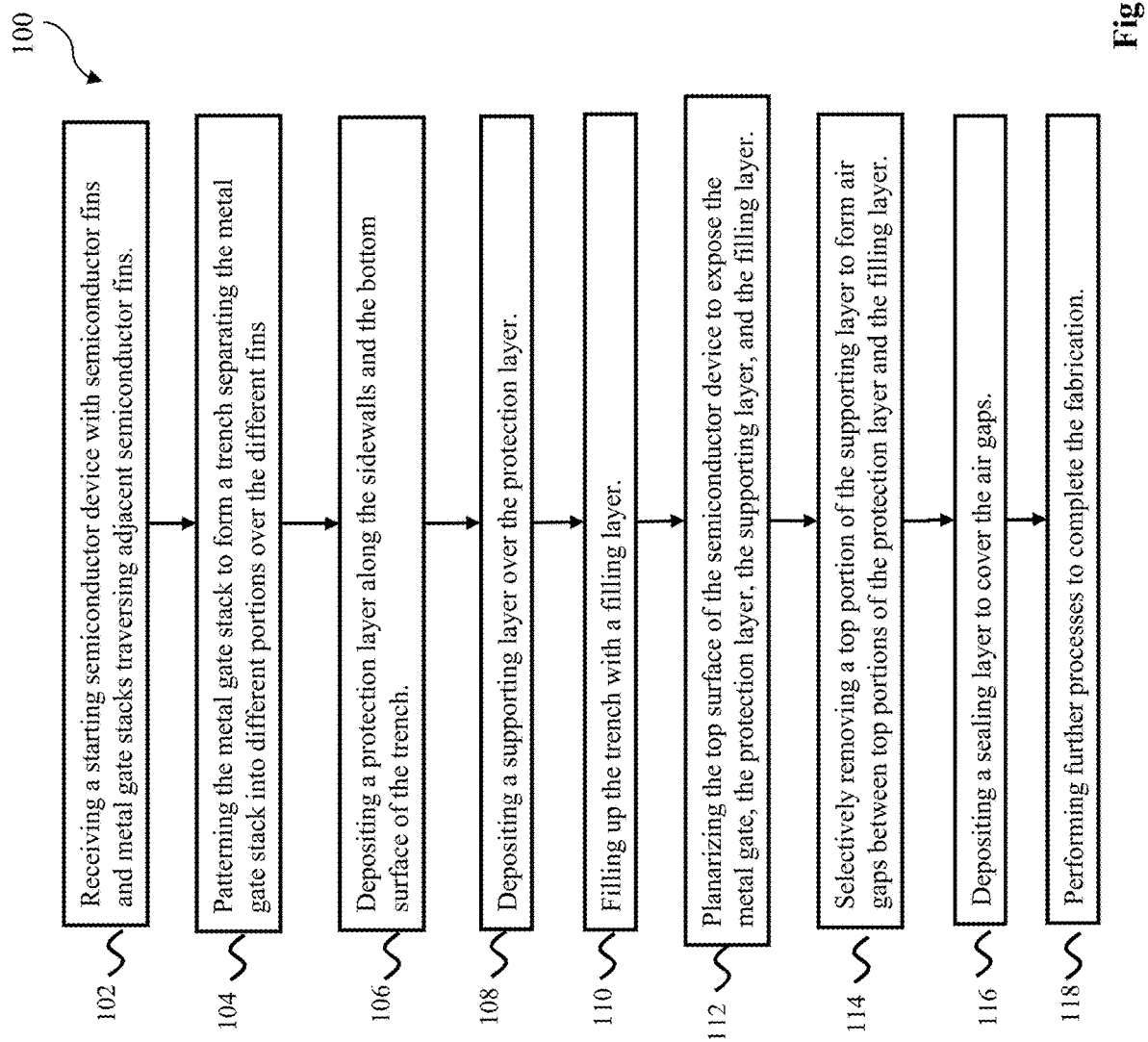
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as multi-gate devices.

One such multi-gate device that has been introduced is the fin field-effect transistor (FinFET). The FinFET gets its name from the fin-like structure which extends from a substrate on which it is formed, and which is used to form the FET channel. In a FinFET device, a channel region of a single device may include multiple layers of semiconductor material of physically separated from one another, and a gate of the device is disposed above, alongside, and even between the semiconductor layers of the device. This configuration is called gate-all-around (GAA) devices, which allow more aggressive gate length scaling for both performance and density improvement. The present disclosure is generally related to formation of multi-gate devices, including FinFETs and GAA devices, wherein a separation feature is formed between the metal gate stacks disposed over adjacent fins. The separation feature includes an air gap which has the lowest dielectric constant and thereby can reduce the parasitic gate-to-gate capacitance and increase the performance of the semiconductor device. Of course, these advantages are merely exemplary, and no particular advantage is required for any particular embodiment.

FIG. 1 illustrates a flow chart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIG. 2 illustrates a three-dimensional view of device 200; and FIGS. 3-11 illustrate cross-sectional views of device 200 taken along plane A-A' in FIG. 2 (that is, along a y-direction).

Device 200 may be an intermediate device fabricated during processing of an integrated circuit (IC), or a portion thereof, that may include static random-access memory (SRAM) and/or other logic circuits, passive components such as resistors, capacitors, and inductors, and active components such as p-type FETs (PFETs), n-type FETs (NFETs), FinFETs, GAA transistors, metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices. FIGS. 2-11 have been simplified for the sake of clarity to better understand the inventive concepts of the present disclosure. Additional features can be added in device 200, and some of the features described below can be replaced, modified, or eliminated in other embodiments of device 200.

Figure 2:
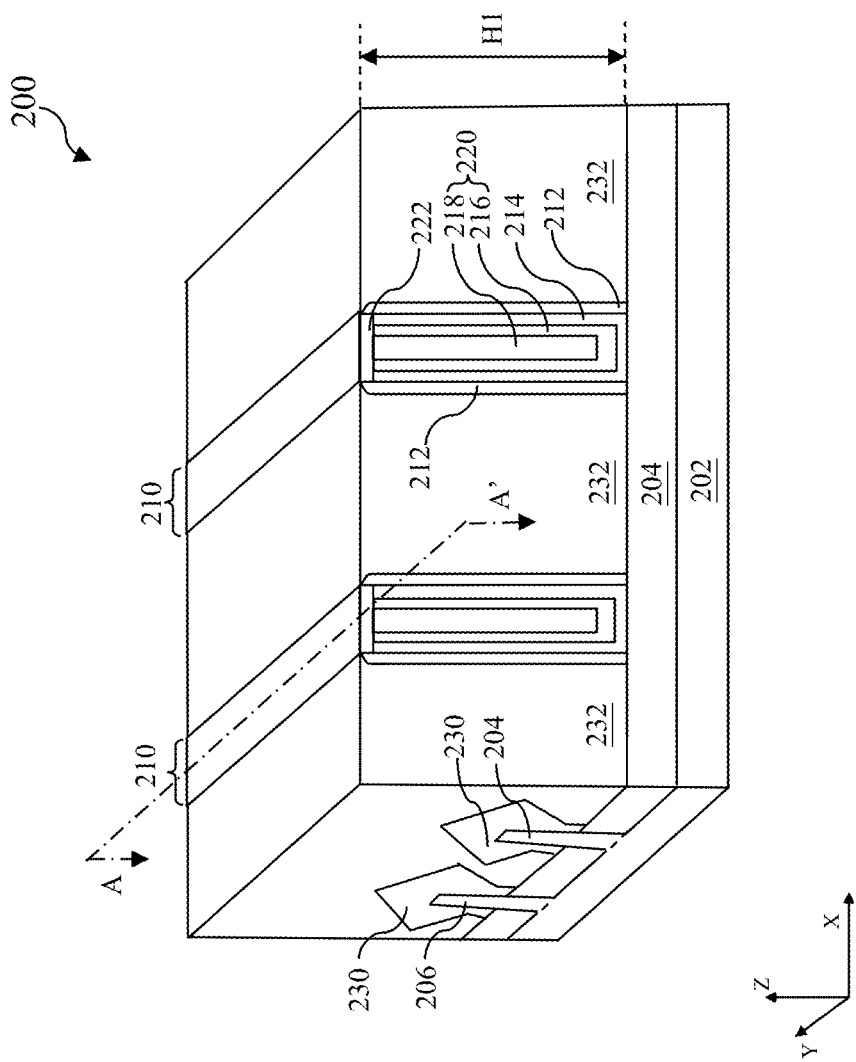
FIG. 2 illustrates a three-dimensional perspective view of an example semiconductor device in accordance with some embodiments of the present disclosure.

Referring to FIGS. 1 and 2, at operation 102, method 100 provides a starting device 200. In the depicted embodiment of FIG. 2, device 200 includes a substrate 202. In the depicted embodiment, substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some examples, substrate 202 includes n-type doped regions (for example, n-type wells) doped with n-type dopants, such as phosphorus (for example, $^{31}P$), arsenic, other n-type dopant, or combinations thereof. In the depicted implementation, substrate 202 includes p-type doped region (for example, p-type wells) doped with p-type dopants, such as boron (for example, $^{11}B$, $BF_2$), indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Device 200 also includes an isolation structure 204 disposed over substrate 202. Isolation structure 204 electrically isolates active device regions and/or passive device regions of device 200. Isolation structure 204 can be configured as different structures, such as a shallow trench isolation (STI) structure, a deep trench isolation (DTI) structure, a local oxidation of silicon (LOCOS) structure, or combinations thereof. Isolation structure 204 includes an isolation material, such as silicon oxide, silicon nitride, silicon oxynitride, other suitable isolation material (for example, including silicon, oxygen, nitrogen, carbon, and/or other suitable isolation constituent), or combinations thereof.

Device 200 further includes semiconductor fins 206 protruding from substrate 202 and the lower portions of semiconductor fins 206 are separated by isolation structure 204. Each semiconductor fin 206 may be suitable for providing an n-type FET or a p-type FET. In some embodiments, fins 206 as illustrated herein may be suitable for providing FETs of the same type, i.e., n-type or p-type. Alternatively, they may be suitable for providing FETs of opposite types, i.e., n-type and p-type. Fins 206 are oriented substantially parallel to one another. Each of fins 206 has at least one channel region and at least one source region and at least one drain region defined along their length in the x-direction, where the at least one channel region is covered by gate stacks 210 and is disposed between the source region and the drain region (both referred to as source/drain regions). In some embodiments, fins 206 are a portion of substrate 202 (such as a portion of a material layer of substrate 202). For example, in the depicted embodiment, where substrate 202 includes silicon, fins 206 include silicon. Alternatively, in some embodiments, fins 206 are defined in a material layer, such as one or more semiconductor material layers, overlying substrate 202. For example, fins 206 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of device 200.

Fins 206 are formed by any suitable process including various deposition, photolithography, and/or etching processes. An exemplary photolithography process includes forming a photoresist layer (resist) overlying substrate 202 (e.g., on a silicon layer), exposing the resist to a pattern, performing a post-exposure bake process, and developing the resist to form a masking element including the resist. The masking element is then used to etch the fin structure into substrate 202. Areas not protected by the masking element are etched using reactive ion etching (RIE) processes and/or other suitable processes. In some embodiments, fins 206 are formed by patterning and etching a portion of silicon substrate 202. In some other embodiments, fins 206 are formed by patterning and etching a silicon layer deposited overlying an insulator layer (for example, an upper silicon layer of a silicon-insulator-silicon stack of an SOI substrate). As an alternative to traditional photolithography, fins 206 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fins 206 may be formed in a similar manner.

In the depicted embodiment of FIG. 2, various metal gate stacks 210 are formed over fins 206. Metal gate stacks 210 extend along y-direction and traverse multiple adjacent fins 206. Gate stacks 210 engage the respective channel regions of fins 206, such that current can flow between the respective S/D regions of fins 206 during operation. Each gate stack 210 may include a gate dielectric layer 214 and a gate electrode 220. Gate dielectric layer 214 may include a high-k dielectric material, which is a material having a dielectric constant that is greater than a dielectric constant of $SiO_2$, which is approximately 3.9. In some embodiments, the high-k gate dielectric includes hafnium oxide (HfO2), which has a dielectric constant that is in a range from approximately 18 to approximately 40. In alternative embodiments, the high-k gate dielectric layer may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. Gate electrode 220 may include a metal-containing material. In some embodiments, gate electrode 220 may include a work function metal (WFM) 216 and a bulk metal 218. WFM 216 is configured to tune a work function of its corresponding FinFET to achieve a desired threshold voltage Vt. In various embodiments, WFM 216 may include TiAl, TiAlN, TaCN, TiN, WN, or W, or combinations thereof. Bulk metal 218 is configured to serve as the main conductive portion of the functional gate structure. In various embodiments, bulk metal 218 may contain Aluminum (Al), Tungsten (W), Copper (Cu), or combinations thereof.

A gate hard mask layer 222 is formed over gate electrode 220 and is considered a part of gate stack 210. Gate hard mask layer 222 includes any suitable material, for example, SiN, SiC, LaO, AlO, AlON, ZrO, HfO, Si, ZnO, ZrN, ZrAlO, TiO, TaO, YO, TaCN, ZrSi, SiOCN, SiOC, SiCN, HfSi, LaO, SiO, spin-on glass (SOG), a low-k film, tetra-ethylorthosilicate (TEOS), plasma enhanced CVD oxide (PE-oxide), high-aspect-ratio-process (HARP) formed oxide, other suitable material, or combinations thereof. Gate hard mask layer 220 is formed over gate electrode 220 by any suitable process. For example, a deposition process may be performed to form gate hard mask layer 220 over substrate 202, fins 206, and isolation structure 204. The deposition process includes CVD, PVD, ALD, HDPCVD, MOCVD, RPCVD, PECVD, LPCVD, ALCVD, APCVD, plating, other suitable methods, or combinations thereof.

Gate spacers 212 are located along the sidewalls of gate stacks 210. Gate spacers 212 may include various layers, for example, one or more dielectric layers and pattern layers. In some embodiments, gate spacer 212 may include any suitable dielectric material, such as silicon, oxygen, carbon, nitrogen, other suitable material, or combinations thereof (for example, silicon oxide, silicon nitride, silicon oxynitride, or silicon carbide). Gate spacers 212 may be formed by various suitable methods, such as various deposition processes (for example, ALD, CVD, PVD, other suitable methods, or combinations thereof), various photolithography processes, and/or various etching processes (for example, dry etch, wet etch, or a combination thereof).

In some embodiments, gate stacks 210 are formed by a gate replacement process after other components (for example, epitaxial S/D features 230 and interlayer dielectric (ILD) layer 232) of device 200 are fabricated. In a gate replacement process, dummy gate structures are formed to wrap the channel regions of respective fins 206. Each dummy gate structure may include a dummy gate electrode comprising polysilicon (or poly) and various other layers, for example, a hard mask layer disposed over dummy gate electrode, and an interfacial layer disposed over fins 206 and substrate 202, and below dummy gate electrode. After the formation of epitaxial S/D features 230 as well as ILD layer 232, dummy gate structures are removed using one or more etching processes (such as wet etching, dry etching, or other etching techniques), therefore leaving openings over the channel regions of fins 206 in place of the removed dummy gate structures. The opening is then filled with a high-K dielectric material to form dielectric layer 214 by various processes, such as ALD, CVD, PVD, and/or other suitable process. Conductive gate material(s) is then deposited over the dielectric material to form metal gate electrodes 220 of gate stacks 210. Gate electrodes 220 are formed by various deposition processes, such as ALD, CVD, PVD, and/or other suitable process. Gate hard mask layer 222 is then formed over gate electrode 220 by any suitable deposition process as those aforementioned. A chemical mechanical polishing (CMP) process can be performed to remove any excess material of gate dielectric layer 214, gate electrodes 220, and/or gate hard mask layer 222 to planarize gate stacks 210.

Device 200 also includes epitaxial S/D features 230 formed in the S/D regions of fins 206. For example, semiconductor material is epitaxially grown on fins 206, forming epitaxial S/D features 230 on fins 206. In some embodiments, a fin recess process (for example, an etch back process) is performed on S/D regions of fins 206, such that epitaxial S/D features 230 are grown from lower fin active regions. In some other embodiments, S/D regions of fins 206 are not subjected to a fin recess process, such that epitaxial S/D features 230 are grown from and wrap at least a portion of upper fin active regions. In furtherance of some embodiments, epitaxial S/D features 230 extend (grow) laterally along the y-direction, such that epitaxial S/D features 230 are merged and span more than one fin. In some embodiments, epitaxial S/D features 230 include partially merged portions and/or fully merged portions.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 206. In some embodiments, epitaxial S/D features 230 are doped with n-type dopants and/or p-type dopants depending on a type of FinFET fabricated in their respective FinFET device region. For example, in p-type FinFET region, epitaxial S/D features 230 can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, in n-type FinFET region, epitaxial S/D features 230 can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In some embodiments, epitaxial S/D features 230 include materials and/or dopants that achieve desired tensile stress and/or compressive stress in the channel regions. In some embodiments, epitaxial S/D features 230 are doped during deposition by adding impurities to a source material of the epitaxy process. In some embodiments, epitaxial S/D features 230 are doped by an ion implantation process subsequent to a deposition process. In some embodiments, annealing processes are performed to diffuse dopants in epitaxial S/D features 230 of device 200.

Device 200 also includes an interlayer dielectric (ILD) layer 232 formed over substrate 202. ILD layer 232 include a material that is different than a material of gate hard mask layers 222 and gate spacers 212 to achieve etching selectivity during subsequent etching processes. ILD layer 232 includes a dielectric material that includes oxygen. For example, ILD layer 232 includes an oxide layer. In some embodiments, ILD layer 232 includes SiO, SiON, TEOS formed oxide, PSG, BPSG, low-k dielectric material (K<3.9), other suitable dielectric material, or combinations thereof. Exemplary low-k dielectric materials include FSG, carbon doped silicon oxide, Black Diamond® (Applied Materials of Santa Clara, California), Xerogel, Aerogel, Parylene, BCB, SiLK (Dow Chemical, Midland, Michigan), polyimide, other low-k dielectric material, or combinations thereof. ILD layer 232 may include a multi-layer structure having multiple dielectric materials and may be formed by a deposition process such as CVD, flowable CVD (FCVD), spin-on-glass (SOG), other suitable methods, or combinations thereof. In some embodiments, an etch stop layer (ESL, not shown) may be formed between substrate 202 and ILD layer 232. Subsequent to the deposition of ILD layer 232, a CMP process and/or other planarization process is performed to planarize the top surface of device 200.

Figure 3:
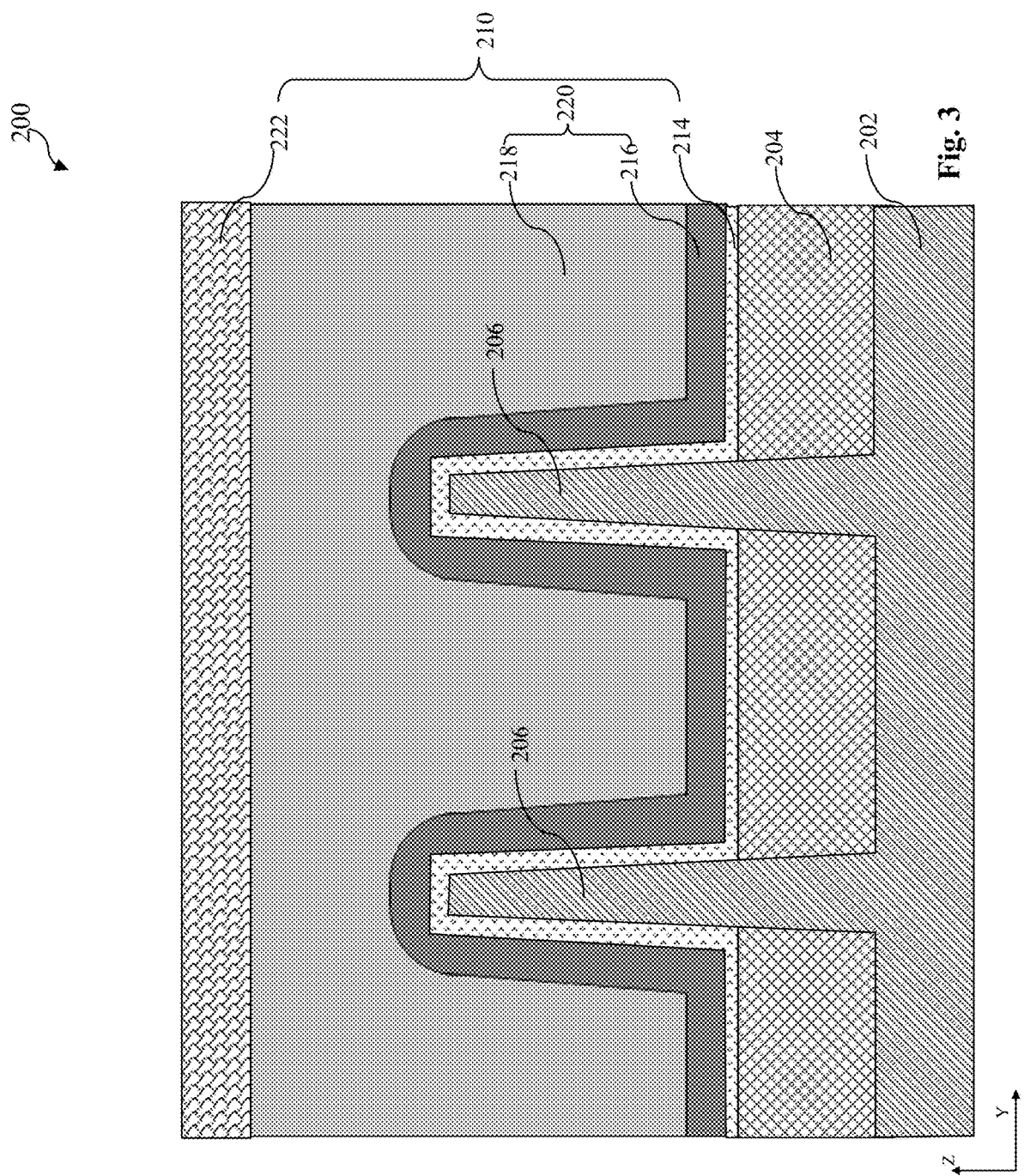
FIGS. 3-11 illustrate cross-sectional views along plane A-A' shown in FIG. 2 of the example semiconductor device at intermediate stages of the method of FIG. 1 in accordance with some embodiments of the present disclosure.

FIG. 3 shows a cross-section view of device 200 along plane A-A' shown in FIG. 2 of device 200. Referring to FIG. 3, gate stack 210, including high-k dielectric layer 214, gate electrode 220, and gate hard mask layer 222, is disposed traversing at least two adjacent fins 206. According to the design requirement of device 200, metal gate stacks over different fins 206 need to be isolated (i.e. cut metal gate). In some conventional processes, a dielectric material, for example silicon nitride (SiN), may be used to fill in the cut metal gate between the adjacent fins for isolation purpose. However, the dielectric constant (i.e. the k value) of SiN is about 7, thus the SiN may generate high parasitic capacitance and impact the ring oscillator speed. In some other conventional processes, other dielectric material, such as silicon dioxide (SiO2), may be used to fill in the cut metal gate between the adjacent fins for isolation purpose. However, although SiO2 is a low-k (k value is about 3.9) dielectric material, it may cause oxygen penetration to the metal gate and thereby induce threshold voltage (Vt) shifting issue. The present disclosure provides a separation feature including an air gap formed in the cut metal gate. The separation feature not only isolates the metal gate stacks over adjacent fins, but also reduces the parasitic gate-to-gate capacitance due to the lowest dielectric constant of air (k value of air is about 1).

Figure 4:
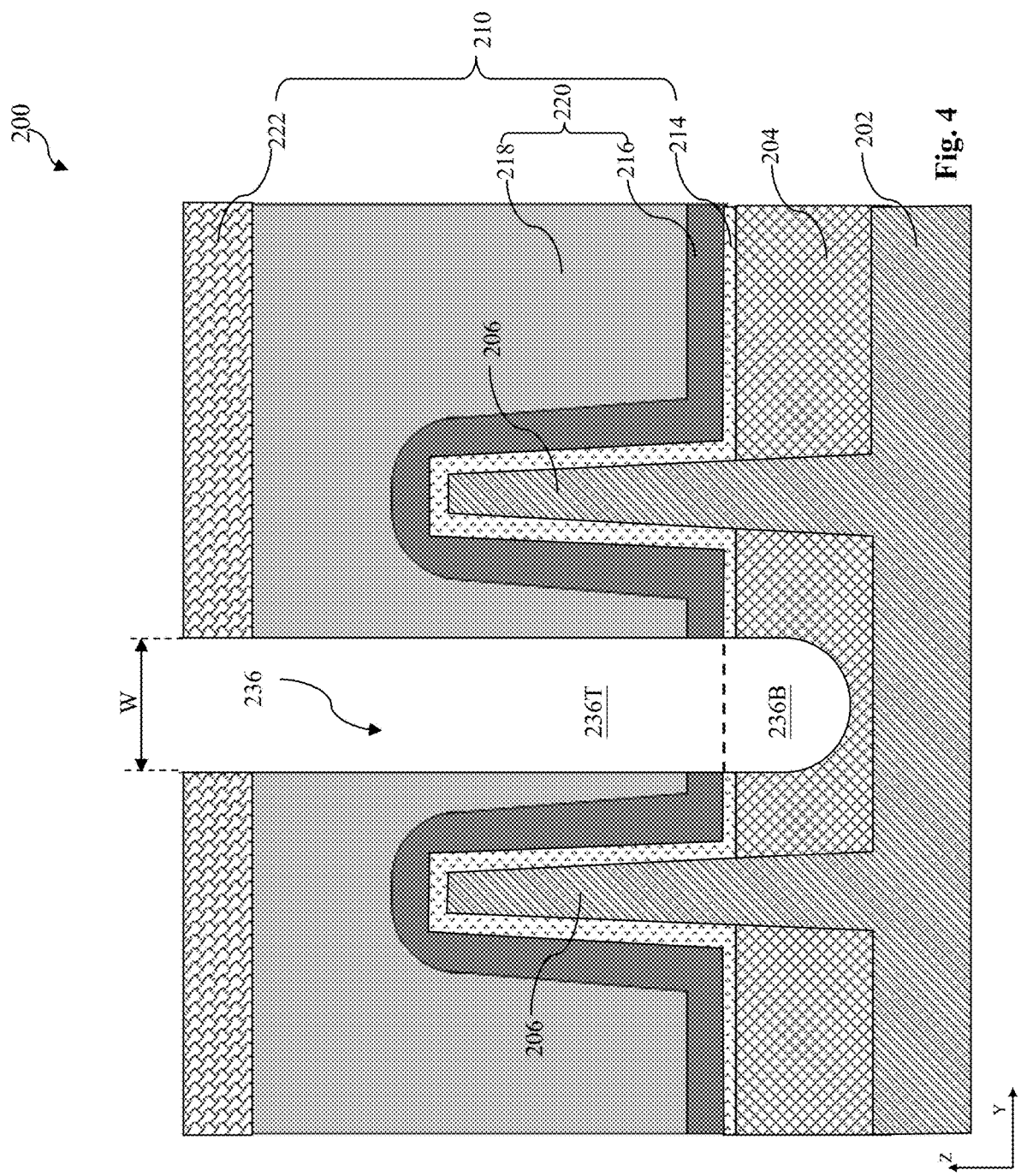

Now referring to FIGS. 1 and 4, at operation 104, the gate stack is patterned to form a trench 236 separating the gate stack into different portions over the different fins 206. Referring to FIG. 4, a portion of isolation structure 204 is also recessed. Trench 236 is formed between adjacent fins 206 and including a top portion 236T and a bottom portion 236B. Top portion 236T of trench 236 is formed within gate hard mask layer 222 and the conductive materials (including bulk metal 218 and WFM 216) of gate stack 210. In other words, top portion 236T of trench 236 includes sidewalls formed by gate hard mask layer 222, bulk metal 218, and WFM 216. Bottom portion 236B of trench 236 is formed along high-k dielectric layer 214 of gate stack 210 and extended into isolation structure 204. In other words, bottom portion 236B of trench 236 includes sidewalls formed by high-k dielectric layer 214 and isolation structure 204. In the depicted embodiment, the bottom portion 236B of trench 236 stop in isolation structure 204. In some other embodiments, the bottom portion 236B of trench 236 may extended into substrate 202. Trench 236 may be formed by various processes including various photolithography and/or etching processes. An exemplary photolithography process includes forming a photoresist layer (resist) overlying gate stack 210, exposing the resist to a pattern, performing a post-exposure bake process, and developing the resist to form a masking element including the resist. The masking element is then used for etching to form trench 236 into gate stack 210 (including hard mask layer 222, bulk metal 218, WFM 216, high-k dielectric layer 214) and isolation structure 204. Thereafter, the masking element is removed to expose gate hard mask layer 222. The etching process can include a dry etching process (for example, a reactive ion etching (RIE) process), a wet etching process, other suitable etching process, or combinations thereof. Thereby, metal gate stack 210 becomes a cut metal gate stack 210. As depicted in FIG. 4, trench 236 has a width W in the y-direction. In some embodiments, the width W is about 10 nanometers (nm) to about 50 nm.

Figure 5:
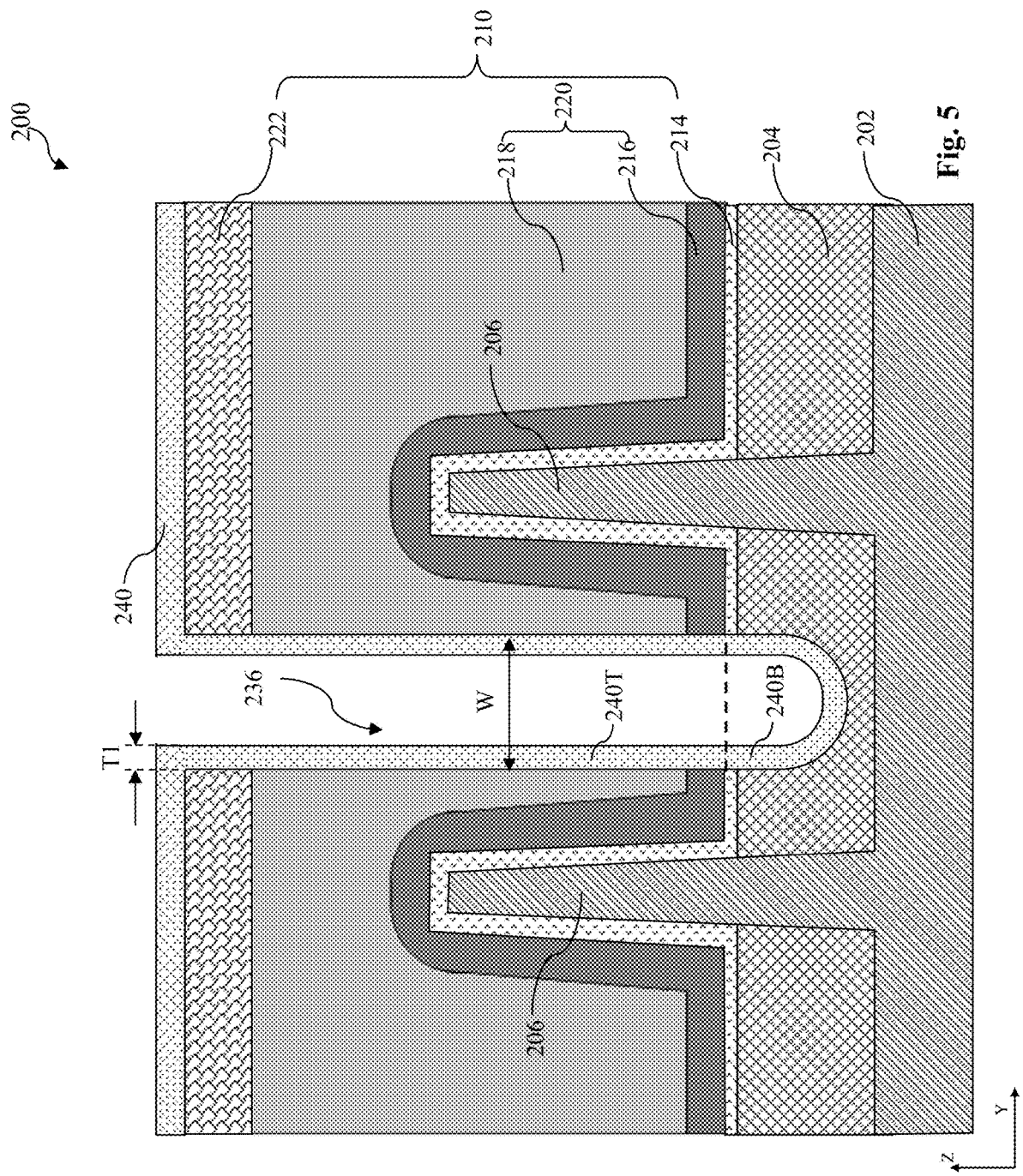
Figure 9:
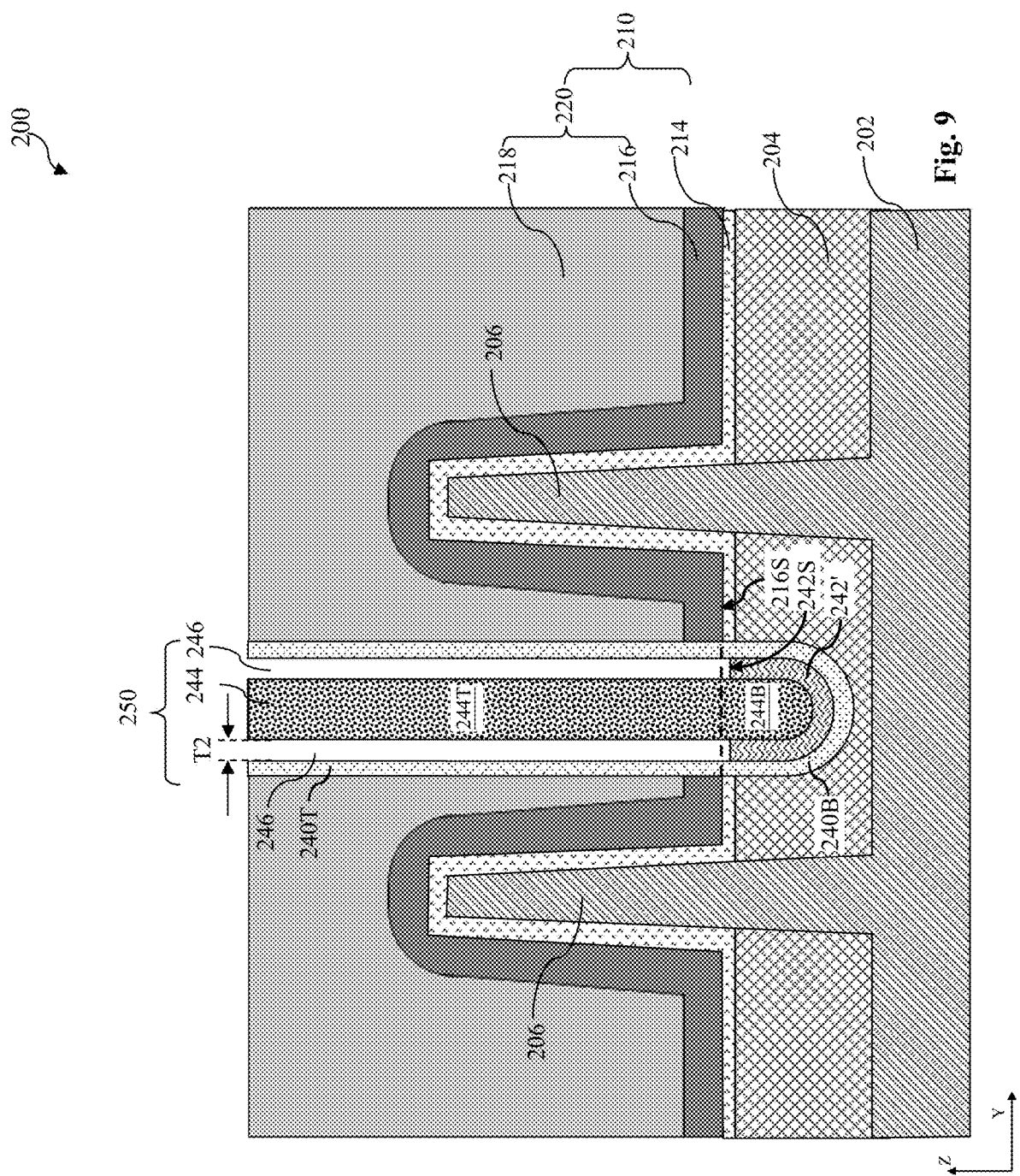
Figure 10:
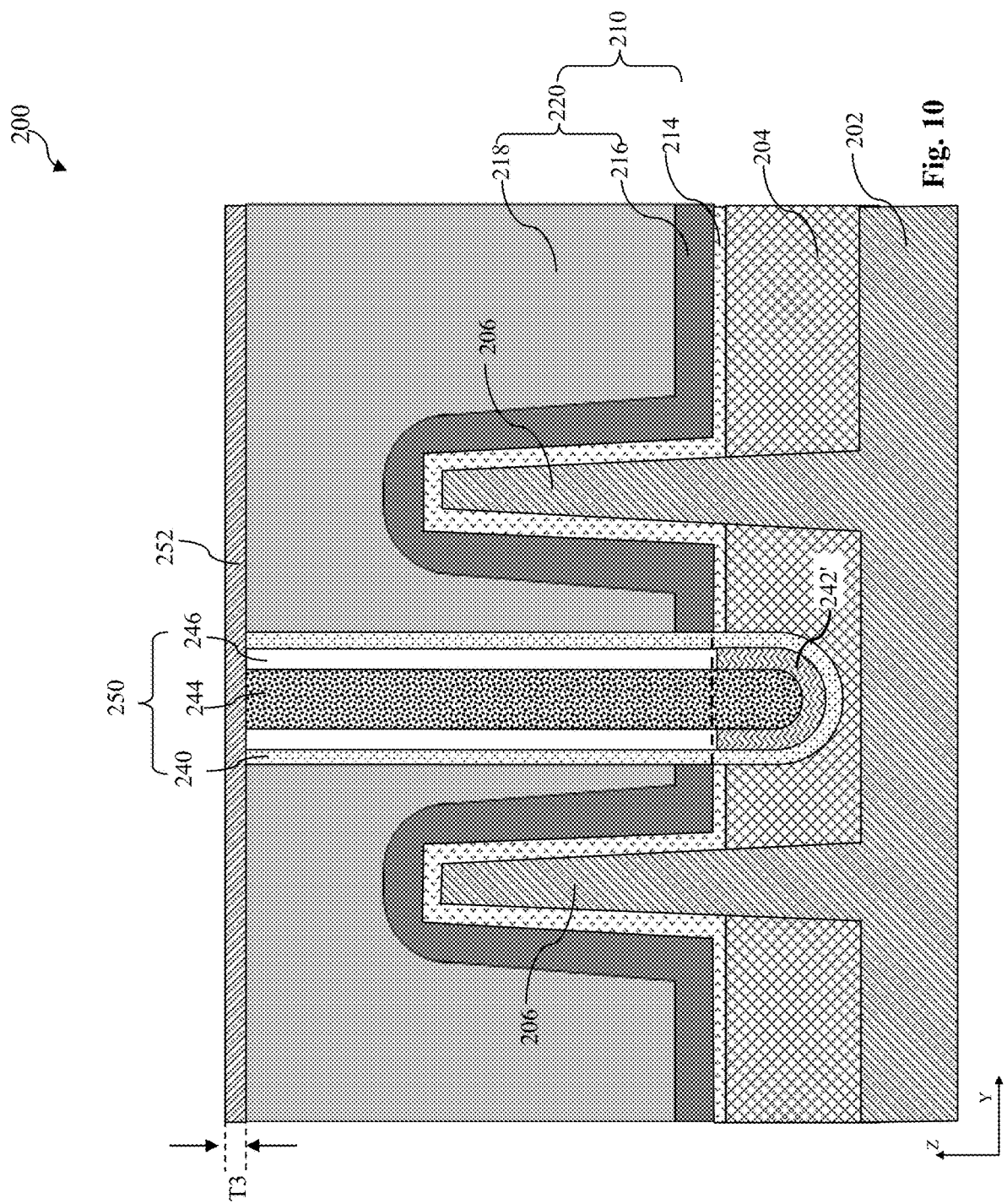
Figure 11:
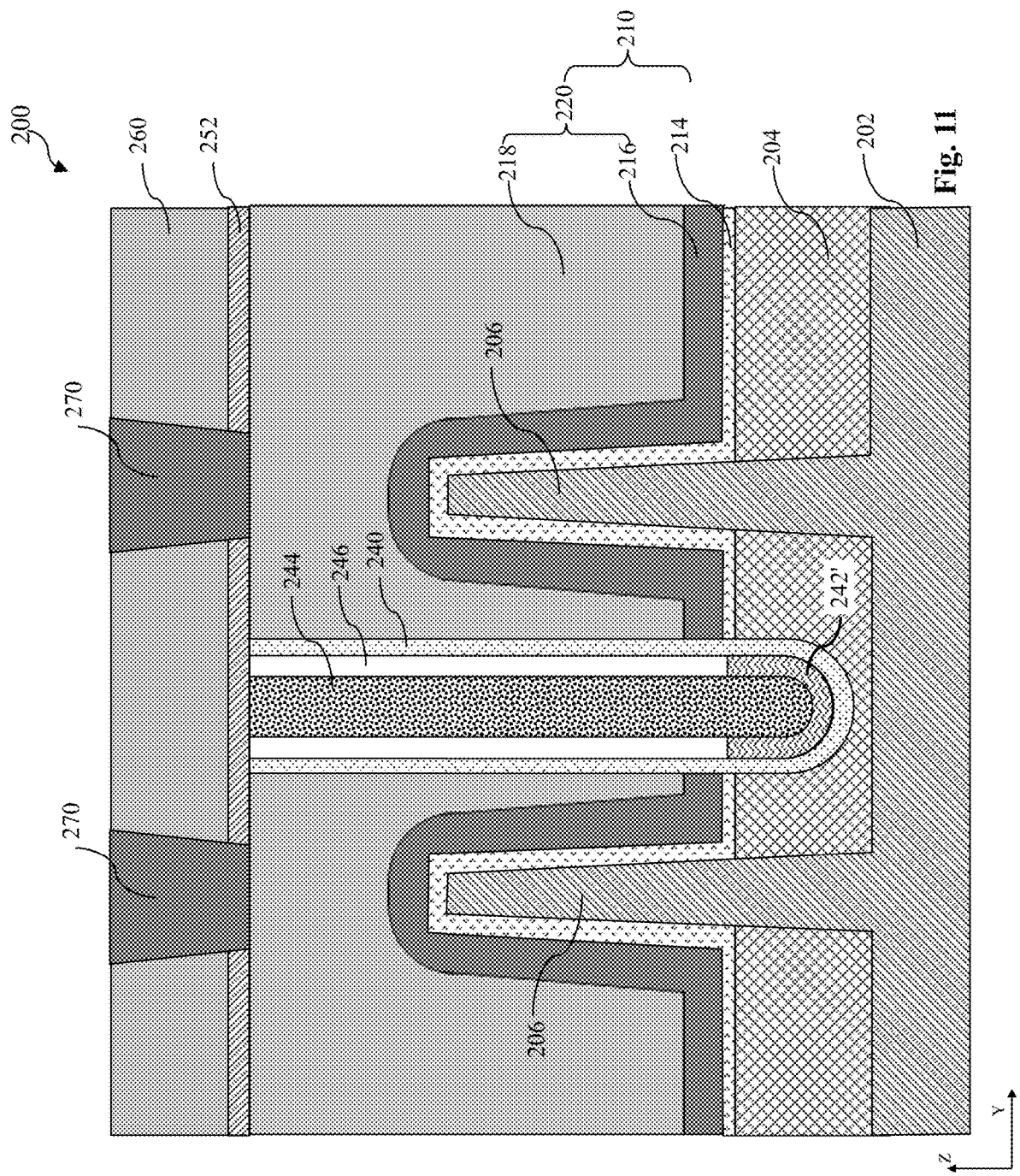

Now referring to FIGS. 1 and 5, at operation 106, a protection layer 240 is deposited in trench 236. Referring to FIG. 5, protection layer 240 is formed over gate hard mask layer 222 and extended along sidewalls and bottom surface of trench 236. Protection layer 240 includes a top portion 240T disposed along sidewalls of top portion 236T of trench 236 as well as over gate hard mask layer 222. Protection layer 240 also includes a bottom portion 240B disposed along sidewalls of bottom portion 236B of trench 236 and extended over the bottom surface of trench 236. In some embodiments, protection layer 240 includes a nitride based dielectric material, for example SiN, SiCN, or combinations thereof, such that protection layer 240 can protect the conductive materials (bulk metal 218 and/or WFM 216) of gate stack 210 from being oxidized in later formed air gaps 246 (FIGS. 9-11). In some embodiments, protection layer 240 is formed by a deposition process such as, CVD, PVD, ALD, other deposition process, or combinations thereof. As depicted in FIG. 5, the portion of protection layer 240 along sidewalls of trench 236 has a thickness T1 in the y-direction. The thickness T1 can be achieved by controlling the processing time and/or flow rate of the deposition process. In some embodiments, a ratio of the width W of trench 236 to the thickness T1 of protection layer 240 is about 3 to about 10. In some further embodiments, the thickness T1 is about 1 nm to about 10 nm.

Figure 6:
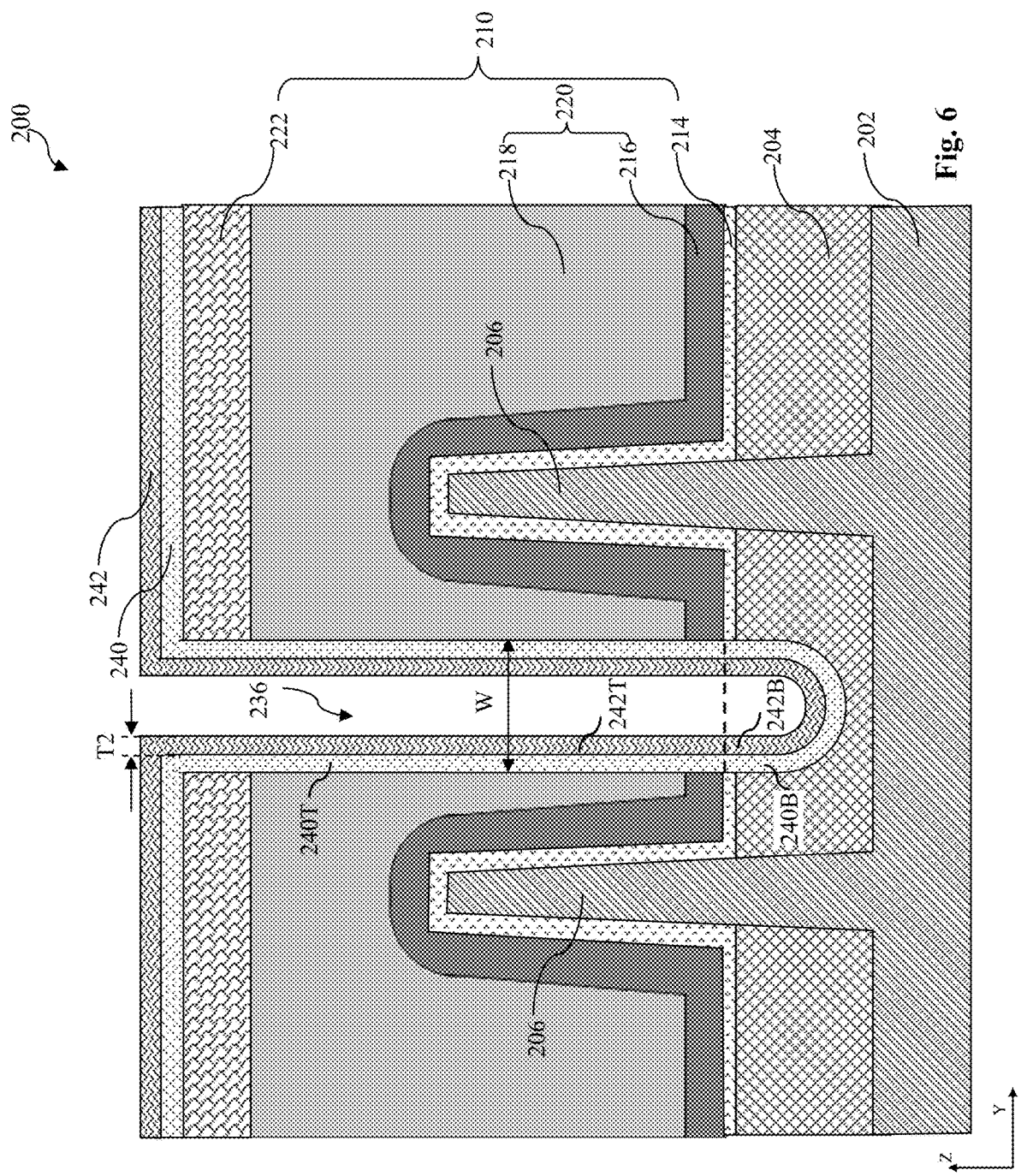

Now referring to FIGS. 1 and 6, at operation 108, a supporting layer 242 is deposited over protection layer 240. Referring to FIG. 6, supporting layer 242 includes a top portion 242T formed along sidewalls of top portion 240T of protection layer 240 and extended over top surface of protection layer 240. Supporting layer 242 also includes a bottom portion 242B formed over bottom portion 240B of protection layer 240. In some embodiments, supporting layer 242 includes amorphous silicon (a-Si), such that good etching selectivities can be provided between supporting layer 242, protection layer 240 and a later formed filling layer 244. Therefore, in a later air gap etching process, a top portion of supporting layer 242 may be selectively removed by a selective etching process. In some embodiments, supporting layer 242 is formed by a deposition process, such as CVD. As depicted in FIG. 6, the portion of supporting layer 242 along sidewalls of protection layer 240 has a thickness T2 in the y-direction. The thickness T2 can be achieved by controlling the processing time and/or flow rate of the deposition process. In some embodiments, a ratio of the width W of trench 236 to the thickness T2 of supporting layer 242 is about 3 to about 10. In some further embodiments, the thickness T2 is about 1 nm to about 10 nm.

Figure 7:
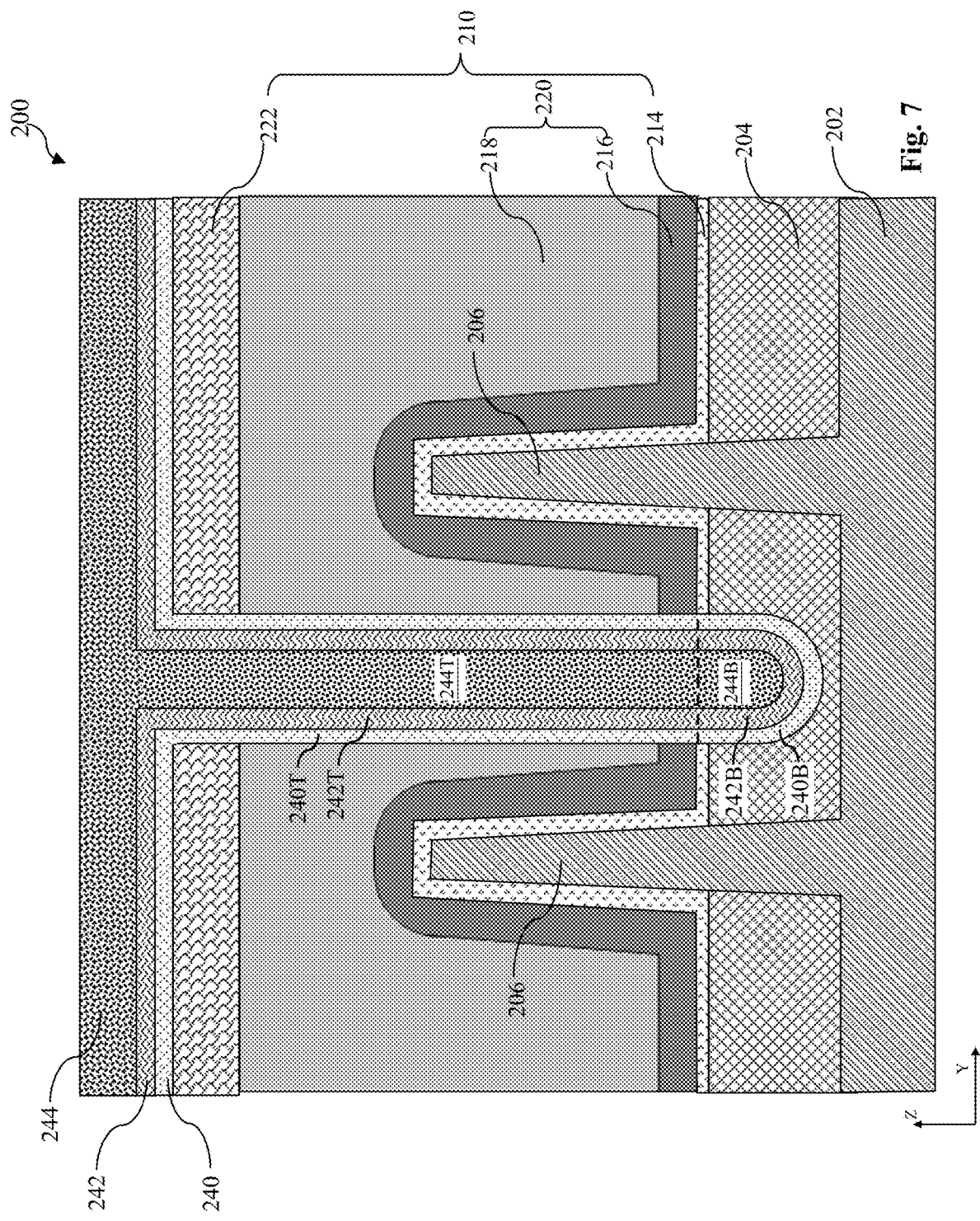

Now referring to FIGS. 1 and 7, at operation 110, a dielectric filling layer 244 is deposited over supporting layer 242 and fills up trench 236. Referring to FIG. 7, filling layer 244 includes a top portion 244T formed over top portion 242T of supporting layer 242 and a bottom portion 244B formed over bottom portion 242B of supporting layer 242. In some embodiments, filling layer 244 includes a dielectric material, such as SiN, SiO, SiCN, SiOCN, SiOC, other dielectric material, or combinations thereof. In some embodiments, filling layer 244 is formed by any suitable deposition process, for example, CVD, PVD, ALD, other deposition process, or combinations thereof.

Figure 8:
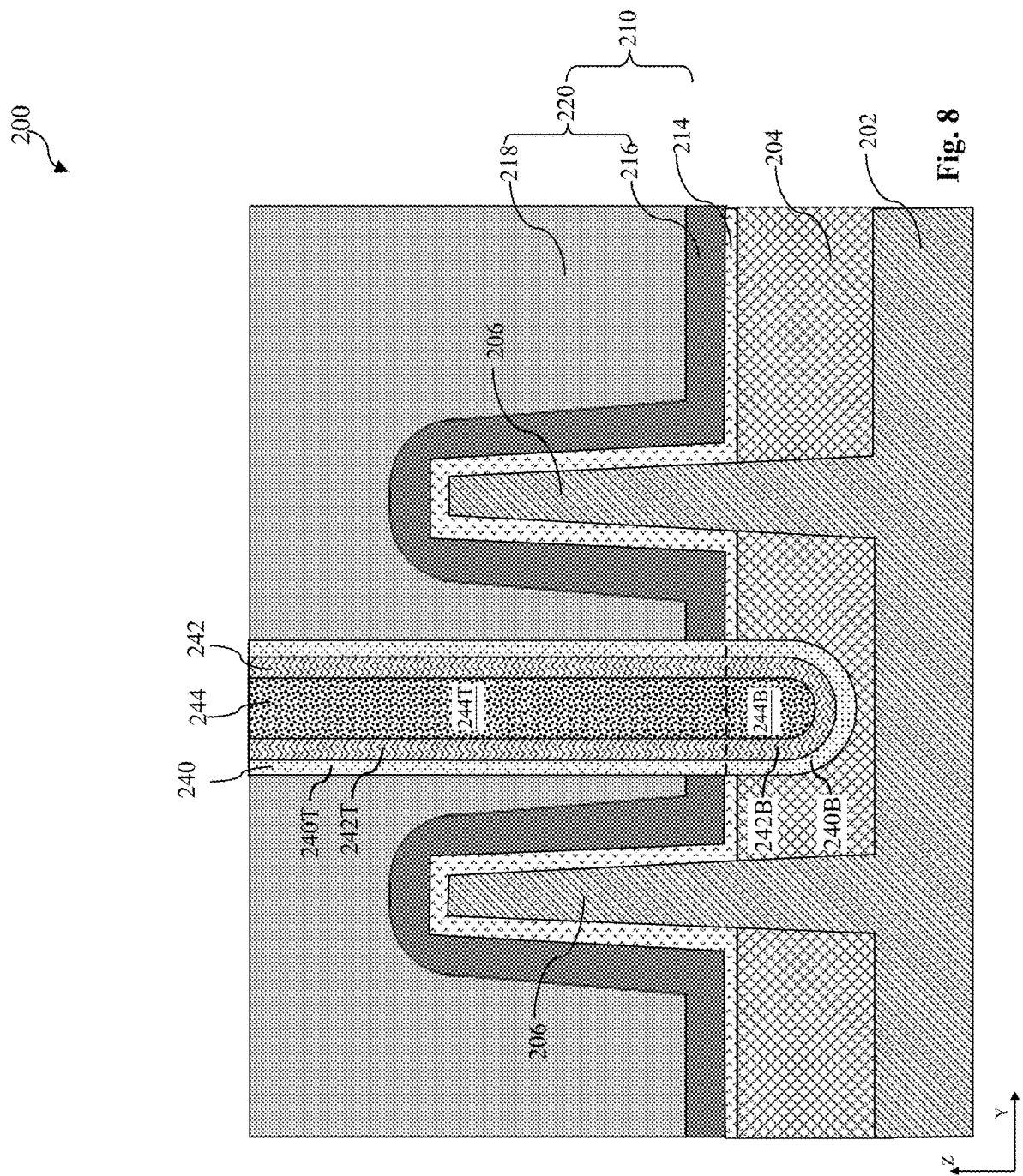

Now referring to FIGS. 1 and 8, at operation 112, a planarization process is performed to device 200 to expose metal gate stack 210. In some embodiments, the planarization process includes a CMP process. In some embodiments, the planarization process also removes gate hard mask layer 222 and portions of protection layer 240, supporting layer 242, and filling layer 244 formed over gate hard mask layer 222. Therefore, after operation 112, bulk metal 218, protection layer 240, supporting layer 242, and filling layer 244 are exposed from the top surface of device 200.

Now referring to FIGS. 1 and 9, at operation 114, top portion 242T of supporting layer 242 is selectively removed to form air gaps 246. The remaining portion of supporting layer 242 is referred to as a recessed supporting layer 242'. Due to the different etching selectivity between supporting layer 242 (including a-Si), protection layer 240 (including SiN) and filling layer 244 (including dielectric material), top portion 242T of supporting layer 242 can be selectively removed by a selective etching process. In some embodiments, the selective etching process is an anisotropical dry etch, such that only portion of supporting layer 242 in the z-direction is removed. The selective dry etch may use an etchant including chlorine, fluorine, bromine, or combinations thereof. Referring to FIG. 9, each air gap 246 has a width T2 in the y-direction, which is substantially the same as the thickness T2 of supporting layer 242. In some embodiments, a ratio of the width W of trench 236 to the width T2 of air gaps 246 is about 3 to about 10. In some further embodiments, the width T2 is about 1 nm to about 10 nm. Air gaps 246 separates at least top portion 240T of protection layer 240 and top portion 244T of filling layer 244. In other words, air gaps 246 are defined between protection layer 240 and filling layer 244. As depicted in FIG. 9, not only top portion 242T of supporting layer is removed, bottom portion 242B of supporting layer 242 is also slightly removed, such that top surface 242S of the recessed supporting layer 242' is below bottom surface 216S of WFM 216, thereby to ensure the complete isolation of the conductive materials of cut metal gate stack 210. Referring to FIG. 9, the recessed supporting layer 242' is formed between bottom portion 240B of protection layer 240 and bottom portion 244B of filling layer 244, such that it can support filling layer 244 from falling towards protection layer 240. In some embodiments, the material of the recessed supporting layer 242' may be oxidized during some later fabrication processes. For example, in a later etching process, the etchant may penetrate into air gaps and oxidize the recessed supporting layer 242', such that the recessed supporting layer 242' may include an oxidized material (for example, SiO). Therefore, the material of the Protection layer 240, air gaps 246, the recessed supporting layer 242', and filling layer 244 combined form a separation feature 250.

As depicted in FIG. 9, separation feature 250 is formed in the cut metal gate stack 210 to isolate metal gate stacks over different fins 206. Compare with the convention semiconductor device, separation feature 250 in the present disclosure includes air gaps isolating the conductive materials of the cut metal gate stack. Due to the lowest dielectric constant of air, the air gaps can also reduce the parasitic gate-to-gate capacitance. Therefore, the ring oscillator speed of the device can be boosted, and the power consumption can be reduced. Separation feature 250 also includes other layers, for example, a protection layer to protect the conductive materials from being oxidized, a filling layer filled in the air gap to provide small air gap openings, and a supporting layer to support the filling layer from falling towards the protection layer.

Now referring to FIGS. 1 and 10, at operation 116, a sealing layer 252 is formed over substrate 200, more particularly over the top surfaces of bulk metal 218, protection layer 240, and filling layer 244. Sealing layer 252 covers top openings of air gaps 246. In some embodiments, sealing layer 252 comprises a dielectric material including nitrogen, such as SiN, SiCN, or combinations thereof. In some embodiments, sealing layer 252 is deposited by CVD, or other deposition process. A thickness T3 of sealing layer 252 is about 5 nm to about 10 nm.

Now referring to FIGS. 1 and 11, at operation 118, further processes are performed to complete the fabrication of device 200. For example, it may form various contacts/vias 270, wires, and multilayer interconnect features (e.g., metal layers and interlayer dielectric layers such as ILD layer 260) over the device 200, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure provide a semiconductor device with a separation feature including an air gap formed in the cut metal gate. The separation feature also includes a protection layer, a filling layer, and a supporting layer disposed between lower portions of the protection layer and the filling layer. The air gap not only isolates the metal gate stacks over different fins, but also reduces the undesired parasitic gate-to-gate capacitance, thereby to increase the ring oscillator frequency, reduce the power consumption, and improve the device performance. The fabrication process can be integrated in the current process flow and can be applied to multiple technology generations.

The present disclosure provides for many different embodiments. Semiconductor device having air gaps formed in the metal gates and methods of fabrication thereof are disclosed herein. An exemplary semiconductor device includes a first semiconductor fin and a second semiconductor fin formed over a substrate, wherein lower portions of the first semiconductor fin and the second semiconductor fin are separated by an isolation structure; a first gate stack formed over the first semiconductor fin and a second gate stack formed over the second semiconductor fin; and a separation feature separating the first gate stack and the second gate stack, wherein the separation feature includes a first dielectric layer and a second dielectric layer with an air gap defined therebetween, and a bottom portion of the separation feature being inserted into the isolation structure.

In some embodiments, the integrated circuit device further comprises a sealing layer disposed over the first dielectric layer and the second dielectric layer and covering an opening of the air gap.

In some embodiments, a material of the first dielectric layer is silicon nitride (SiN). In some embodiments, the air gap is formed between a top portion of the first dielectric layer and a top portion of the second dielectric layer, and a supporting layer is formed between a bottom portion of the first dielectric layer and a bottom portion of the second dielectric layer. In some embodiments, each of the first gate stack and the second gate stack includes a gate dielectric layer and a gate electrode disposed over the gate dielectric layer, and a top surface of the supporting layer is below a bottom surface of the gate electrode. In some embodiments, a material of the supporting layer is amorphous silicon. In some embodiments, a material of the supporting layer is silicon oxide. In some embodiments, a width of the supporting layer is substantially the same as a width of the air gap. In some embodiments, a width ratio of the separation feature to the air gap is about 3 to about 10.

Another semiconductor device comprises a first semiconductor fin and a second semiconductor fin extending from a substrate; a gate stack formed over the first semiconductor fin and the second semiconductor fin; and a separation feature cutting into the gate stack and separating the gate stack into a first portion over the first semiconductor fin and a second portion over the second semiconductor fin, wherein the separation feature includes a protection layer and a filling layer defining an air gap therebetween; and a sealing layer disposed over the protection layer and the filling layer and covering an opening of the air gap.

In some embodiments, a top portion of a sidewall of the protection layer contacts sidewalls of the first portion and the second portion of the gate stack. In some embodiments, the separation feature further comprises a supporting layer formed between a bottom portion of the protection layer and a bottom portion of the filling layer, and a material of the supporting layer is different from a material of the protection layer. In some embodiments, the supporting layer, the bottom portion of the protection layer, and the bottom portion of the filling layer are embedded in an isolation structure. In some embodiments, the supporting layer is disposed below a conductive material of the gate stack.

An exemplary method includes forming a gate stack over a first semiconductor fin and a second semiconductor fin; patterning the gate stack to form a trench separating the gate stack into a first portion over the first semiconductor fin and a second portion over the second semiconductor fin; depositing a protection layer along sidewalls and a bottom surface of the trench; depositing a supporting layer over the protection layer; depositing a filling layer over the supporting layer to fill in the trench; and removing a portion of the supporting layer to form an air gap between the protection layer and the filling layer.

In some embodiments, the method further comprises planarizing a top surface of the semiconductor device before removing a portion of the supporting layer; and forming a sealing layer over the gate stack to cover an opening of the air gap.

In some embodiments, removing a portion of the supporting layer to form the air gap includes selectively recessing a top portion of the supporting layer to form the air gap while keeping a bottom portion of the supporting layer to form a recessed supporting layer between a bottom portion of the protection layer and a bottom portion of the dielectric layer. In some further embodiments, the gate stack includes a gate dielectric layer and a gate electrode disposed over the gate dielectric layer and the recessed supporting layer is below a bottom surface of the gate electrode. In some further embodiments, the method further comprises oxidizing the recessed supporting layer such that the recessed supporting layer includes an oxidized material.

In some embodiments, a material of the supporting layer is different from a material of the protection layer and the dielectric layer, such that the supporting layer is removed by an anisotropical dry etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a dielectric isolation structure disposed on a substrate;
    a first fin structure and a second fin structure disposed on the substrate and extending through the dielectric isolation structure;
    a first gate stack disposed on the first fin structure and a second gate stack disposed on the second fin structure; and
    a separation feature disposed between the first gate stack and the second gate stack, wherein the separation feature includes a first dielectric layer and a second dielectric layer with an air gap defined therebetween, wherein a portion of the first dielectric layer interfaces with the dielectric isolation structure.

2. The device of claim 1, wherein the portion of the first dielectric layer is embedded within the dielectric isolation structure.

3. The device of claim 1, wherein the first dielectric layer has a different material composition than the second dielectric layer.

4. The device of claim 1, wherein the separation feature includes a third dielectric layer surrounding a bottom portion of the second dielectric layer.

5. The device of claim 4, wherein the third dielectric layer interfaces with the first and second dielectric layers.

6. The device of claim 4, wherein the dielectric isolation structure extends to a first height above the substrate, and wherein the third dielectric layer extends to a second height above the substrate that is different than the first height.

7. The device of claim 6, wherein the second height is greater than the first height.

8. A device comprising:
    a dielectric isolation structure disposed on a substrate;
    a first fin structure and a second fin structure disposed on the substrate and extending through the dielectric isolation structure;
    a first gate stack disposed on the first fin structure and a second gate stack disposed on the second fin structure; and
    a separation feature disposed between the first gate stack and the second gate stack, wherein the separation feature includes a first dielectric layer, a second dielectric layer and a third dielectric layer, wherein the first, second and third dielectric layers define an air gap and are each exposed to the air gap.

9. The device of claim 8, wherein the first dielectric layer includes a material selected from the group consisting of SiN and SiCN, wherein the second dielectric layer includes SiO, and wherein the third dielectric layer includes a material selected from the group consisting of SiN, SiO, SiCN, SiOCN, and SiOC.

10. The device of claim 8, wherein the first, second and third dielectric layers extend within the dielectric isolation structure.

11. The device of claim 10, wherein the air gap is disposed above the dielectric isolation structure and does not extend within the dielectric isolation structure.

12. The device of claim 10, wherein a portion of the dielectric isolation structure is disposed directly under the separation feature such that the separation feature does not extend completely through the dielectric isolation structure.

13. A device comprising:
a dielectric isolation structure disposed on a substrate;
a first fin structure and a second fin structure disposed on the substrate and extending through the dielectric isolation structure;
a first gate stack disposed on the first fin structure and a second gate stack disposed on the second fin structure; and
a separation feature disposed between the first gate stack and the second gate stack, wherein the separation feature includes a first dielectric layer and a second dielectric layer with an air gap defined therebetween, wherein a portion of the first dielectric layer interfaces with the dielectric isolation structure, wherein the first fin structure and the second fin structure extend to a first height above the substrate, wherein the separation feature extends to a second height greater than the first height.

14. The device of claim 13,
wherein the first gate stack includes a gate dielectric layer and a gate electrode layer,
wherein the gate dielectric layer and the gate electrode layer interface with the separation feature.

15. The device of claim 13, wherein the first dielectric layer includes a nitrogen-containing material.

16. The device of claim 13, wherein the first dielectric layer and the second dielectric layer comprise different etching selectivity.

17. The device of claim 13, wherein the separation feature further comprises a third dielectric layer sandwiched between a bottom portion of the second dielectric layer and a bottom portion of the first dielectric layer.

18. The device of claim 17, wherein the third dielectric layer is exposed in the air gap.

19. The device of claim 17, wherein the third dielectric layer comprises amorphous silicon.

20. The device of claim 13, wherein top surfaces of the first gate stack, the second gate stack, the first dielectric layer, and the second dielectric layer are coplanar.

* * * * *